United States Patent
Lv et al.

(10) Patent No.: US 9,111,995 B2
(45) Date of Patent: Aug. 18, 2015

(54) METHOD FOR IMPROVING ANTI-RADIATION PERFORMANCE OF SOI STRUCTURE

(71) Applicant: Institute of Microelectronics, Chinese Academy of Sciences, Beijing (CN)

(72) Inventors: Yinxue Lv, Beijing (CN); Jinshun Bi, Beijing (CN); Jiajun Luo, Beijing (CN); Zhengsheng Han, Beijing (CN); Tianchun Ye, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/364,984

(22) PCT Filed: Oct. 25, 2012

(86) PCT No.: PCT/CN2012/083474
§ 371 (c)(1),
(2) Date: Jun. 12, 2014

(87) PCT Pub. No.: WO2013/086902
PCT Pub. Date: Jun. 20, 2013

(65) Prior Publication Data
US 2014/0349463 A1  Nov. 27, 2014

(30) Foreign Application Priority Data
Dec. 14, 2011  (CN) .......................... 2011 1 0418276

(51) Int. Cl.
*H01L 21/762* (2006.01)
*H01L 21/265* (2006.01)
*H01L 21/324* (2006.01)

(52) U.S. Cl.
CPC .... *H01L 21/76243* (2013.01); *H01L 21/26533* (2013.01); *H01L 21/324* (2013.01); *H01L 21/7624* (2013.01)

(58) Field of Classification Search
None
See application file for complete search history.

(56) References Cited

U.S. PATENT DOCUMENTS

| | | | | |
|---|---|---|---|---|
| 2004/0171228 | A1* | 9/2004 | Matsumura et al. | 438/407 |
| 2010/0112780 | A1* | 5/2010 | Thompson et al. | 438/458 |
| 2012/0302045 | A1* | 11/2012 | Yamada et al. | 438/478 |

FOREIGN PATENT DOCUMENTS

| | | |
|---|---|---|
| CN | 102437087 A | 5/2012 |
| CN | 102522362 A | 6/2012 |
| KR | 10-2010-0096480 A | 9/2010 |

OTHER PUBLICATIONS

International Preliminary Report on Patentability for International Application PCT/CN2012/083474 dated Jun. 17, 2014 (6 pages).
International Search Report for corresponding International Application No. PCT/CN2012/083474, mailed Jan. 17, 2013 (5 pages).
Written Opinion for International Application No. PCT/CN2012/083474, mailed Jan. 17, 2013 (4 pages).

* cited by examiner

*Primary Examiner* — Scott B Geyer
(74) *Attorney, Agent, or Firm* — Osha Liang LLP

(57) ABSTRACT

A method for improving anti-radiation performance of SOI structure that includes implementing particle implantations of high-energy neutrons, protons and γ-rays to a buried oxide layer of an SOI structure, and then performing annealing process. The high-energy particle implantation introduces displacement damage to the buried oxide layer of the SOI structure.

6 Claims, 3 Drawing Sheets

METHOD FOR IMPROVING ANTI-RADIATION PERFORMANCE OF SOI STRUCTURE

CROSS REFERENCE TO RELATED APPLICATION

This application is a national stage application, filed under 35 U.S.C. §371, of PCT Application No. PCT/CN2012/083474, filed on Oct. 25, 2012, entitled "METHOD FOR IMPROVING IRRADIATION RESISTING PERFORMANCE OF SOI STRUCTURE", which claims priority to Chinese Application No. 201110418276.8, filed on Dec. 14, 2011, all of which are hereby incorporated by reference in their entirety.

FIELD OF THE INVENTION

The present invention relates to a semiconductor manufacturing technology, particularly, to a method for improving anti-radiation performance of SOI structures.

BACKGROUND OF THE INVENTION

Silicon on insulator (Silicon-On-Insulator, SOI) technology is an all-dielectric isolation technology, namely, a buried oxide layer lies between the top silicon film and the substrate for isolating the film of active devices from the substrate. Devices build on the SOI technology are known as SOI devices. As shown, FIG. 1 illustrates a diagram of a cross-sectional view of the structure of a typical SOI CMOS structure in the prior art. Excellent isolation can be achieved owing to the existence of a buried oxide layer; the volume of the active region of the SOI device is rather small, so the SOI device has a lower leakage current than body silicon does and has no latch-up effect as well; thus, SOI devices show incomparable advantages over other devices in the term of anti-radiation performance. However, it is exactly because of the existence of the buried oxide layer, there are a lot of hole traps inside the SOI device. Consequently, when the SOI device continues to work in an ionizing radiation environment, ionizing radiation excites electron-hole pairs within the buried oxide layer, then electrons will soon migrate out of the buried oxide layer, but the holes will be captured by the hole traps, which then become fixed spatial positive charges and result in accumulation of positive charges. These fixed spatial positive charges mainly aggregate near the interface of the top silicon film and the buried oxide layer. When the positive charges accumulated inside the buried oxide layer reach a certain extent, the back gate interface of SOI N-channel transistors will turn into anti-configuration, which consequently results in increase of the leakage current in the device, drift of the electrical characteristics parameters and eventually failure of the device. Therefore, researches are currently focusing on how to improve the total dose anti-radiation performance of SOT devices.

In the prior art, following two ways are adopted to improve anti-radiation performance of SOI structures, so as to improve the total dosage anti-radiation performance of SOI devices.

The first way is to improve back gate threshold voltage by implanting Boron cations into the silicon substrates of SOI structures so as to improve anti-radiation performance of SOI devices.

The second way is to introduce to the buried oxide layer deep electron traps or recombination centres so as to prevent electrons generated by the radiation from migrating out of the buried oxide layer, which thus is able to maintain electrical neutrality in the buried oxide layer and thereby improving anti-radiation performance of the buried oxide layer. Ions introduced into the buried oxide layer should be able to combine easily with electrons generated by the radiation, and the combination cannot be separated easily; nor will the ions be allocated afresh in the buried oxide layer. Usually, the common practice is to implant ions (e.g., Si, N, Al or the like) into the buried oxide layer, and to introduce into the buried oxide layer deep electron traps or recombination centres. Take implantation of Si into the buried oxide layer as an example. Implanted Si forms electron traps within the buried oxide layer; when these electron traps are filled, they will compensate trapped positive charges, thereby reducing net positive charges in the buried oxide layer. Take N implantation into the buried oxide layer as an example. In respect of a typical SOI device, given the existence of hole traps of high concentration within the buried oxide layer, the holes in the electron-hole pairs in the whole buried oxide layer generated by radiation are almost captured in situ, while the electrons are captured by electron traps at shallow energy level and then thermally evaporate quickly. Electrons that are thermally excited are subsequently swept out of the buried oxide layer by the electrical field. In this case, the buried oxide layer carries positive charges in the macro sense, which would adversely affect the normal use and performance of the SOI devices. Implantation of N ions will produce a large number of electron traps within the buried oxide layer and, after annealing process, N ions combine with Si thereby forming Si—N bonds with fairly strong bond energy, which thence substitute for some weak bonds. The substitution for weak bonds is able to reduce electron-hole pairs in the buried oxide layer generated by the ionizing radiation, thereby improving anti-radiation performance of SOI devices. Besides, during the process of ionizing radiation, the electrons captured by the electron traps not only can function as recombination centres for attracting holes generated by the radiation, but also can compensate the holes that have been captured by hole traps; this helps to achieve electrical neutrality in the macro sense. Additionally, these electron traps further affect electrical field in the buried oxide layer, which is favourable for recombination of electron-hole pairs generated by the radiation.

However, the above two ways have some shortcomings. Specifically, the first way is reduced to such a shortcoming as limited capacity to improve anti-radiation performance of SOI structures. The shortcoming of the second method is: it is inevitable to cause some implanting damage to the top silicon film during the process of implanting ions into the buried oxide layer of the SOI structure. Although the damage can be substantially eliminated through annealing performed after the implantation, some defect left after the annealing still casts influence on the performance of the SOI device. Furthermore, although ion implantation can effectively improve anti-radiation performance of the buried oxide layer, it may affect the internal microstructure of the buried oxide layer, which is represented by changes to the electrical characteristic of the buried oxide layer in the macro sense. But the change as such may in turn affect improvement to the anti-radiation performance of the SOI structure that may be achieved through ion implantation. For example, N ion implantation of high dosage will affect the structure of the buried oxide layer, which consequently causes relaxation to the originally dense $SiO_2$ atom network, then Si—O—Si bond angle becomes larger; this consequently causes more holes to be trapped in the buried oxide layer, and is adverse to the anti-radiation performance of the SOI device. Meanwhile, N implantation will cause decrease in back gate threshold voltage of the NMOSFET but increase in back gate threshold voltage of PMOSFET.

Accordingly, there is an urgent need to put forward a method capable of improving anti-radiation performance of an SOI structure but being free from aforementioned problems.

SUMMARY OF THE INVENTION

The present invention aims to provide a method for improving anti-radiation performance of SOI structures. The method is capable of improving anti-radiation performance of SOI structure thereby further improving anti-radiation performance of SOI devices by means of introducing displacement damage in an SOI buried oxide layer through radiating SOI materials with high-energy radiation out of high-energy neutrons, protons and γ-rays, so as to form defects analogous to recombination centres and to reduce electron-hole pairs generated by the radiation.

The present invention provides a method for improving anti-radiation performance of SOI structures, comprising:

performing high-energy particle implantation to a buried oxide layer of the SOI structure and performing annealing process to the same.

As compared to the prior art, the present invention has the following advantages: defects are formed through introducing displacement damage in the buried oxide layer by means of radiating high-energy neutrons, protons and γ-rays using an accelerator; the defects are analogous to the recombination centres that can shorten the lifetime of carriers; in this way, the large number of electron-hole pairs generated by the radiation can be recombined by the recombination centres, thereby significantly reducing the number of holes captured by the hole traps in the buried oxide layer. Additionally, the radiating protons, neutrons and γ-rays introduce no more than displacement damage to the buried oxide layer, which will not affect the electrical neutral characteristic of SOI devices as compared to the introduction of deep electron traps or recombination centres into the buried oxide layer by means of ion implantation adopted in the prior art, so the method of the present invention will not causes adverse effects, such as drift of back gate threshold voltage of SOI devices, which subsequently causes changes to the electrical characteristic of the buried oxide layer. Accordingly, the method is capable of effectively improving anti-radiation performance of the back gate buried oxide layer of SOI structures, thereby improving the anti-radiation performance of SOI devices.

BRIEF DESCRIPTION OF THE DRAWINGS

Aforesaid and/or additional characteristics and advantages of the present invention are made more evident and easily understood according to perusal of the following detailed description of exemplary embodiment(s) in conjunction with accompanying drawings, wherein.

DETAILED DESCRIPTION OF THE INVENTION

Figure 1:
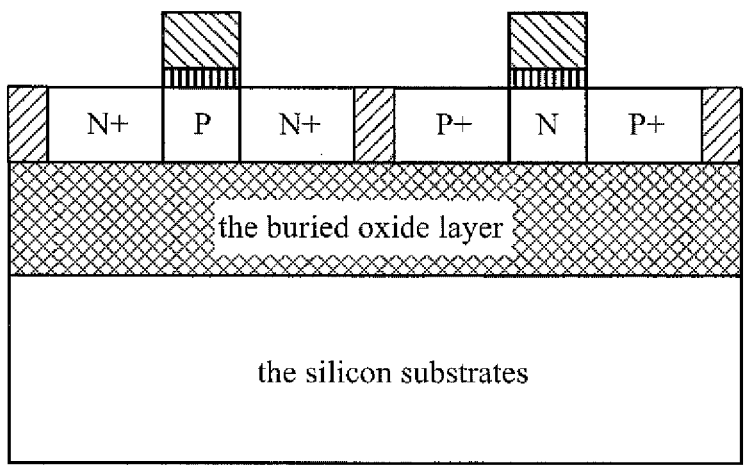
FIG. 1 illustrates a cross-sectional diagram of an SOI CMOS structure in the prior art.

Embodiments of the present invention are described in detail here below, wherein examples of the embodiments are illustrated in the drawings. It should be appreciated that the embodiments described below in conjunction with the drawings are illustrative and are provided for explaining the prevent invention only, thus shall not be interpreted as limitations to the present invention.

Various embodiments or examples are provided here below to implement different structures of the present invention. To simplify the disclosure of the present invention, description of components and arrangements of specific examples is given below. Of course, they are illustrative only and not limiting the present invention. Moreover, in the present invention, reference numbers and/or letters may be repeated in different embodiments. Such repetition is for purposes of simplification and clarity, yet does not denote any relationship between respective embodiments and/or arrangements being discussed. Furthermore, the present invention provides various examples for various process and materials. However, it is obvious for a person of ordinary skill in the art that other processes and/or materials may be utilized alternatively. It should be noted that the component(s) illustrated in the drawings might not be drawn to scale. Description of conventional components, processing technology and crafts are omitted herein in order not to restrict the present invention unnecessarily.

Figure 2:
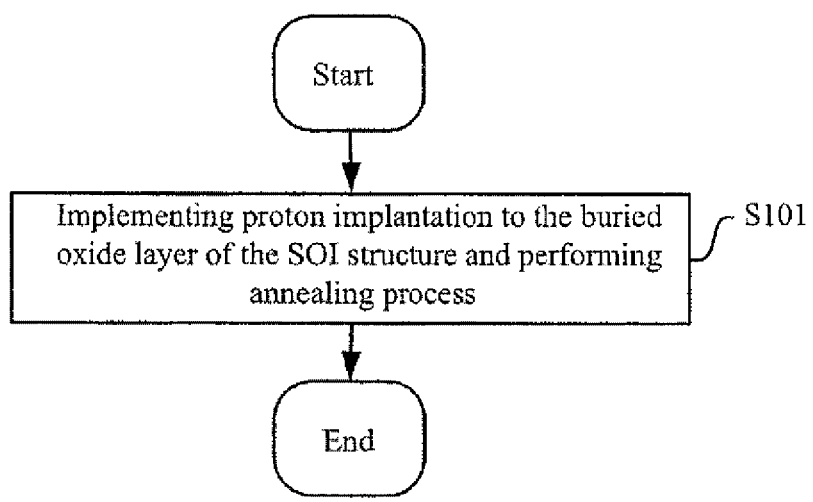
FIG. 2 illustrates a flow chart of the method for improving the anti-radiation performance of an SOI structure according to the present invention.

Here below, the method for improving the anti-radiation performance of SOI structures shown in FIG. 2 are to be described in detail in conjunction with FIG. 3 and FIG. 4.

An SOI structure usually comprises a substrate 100, a buried oxide layer 110 located on the substrate and a silicon layer 120 located on the buried oxide layer 110.

Figure 3:
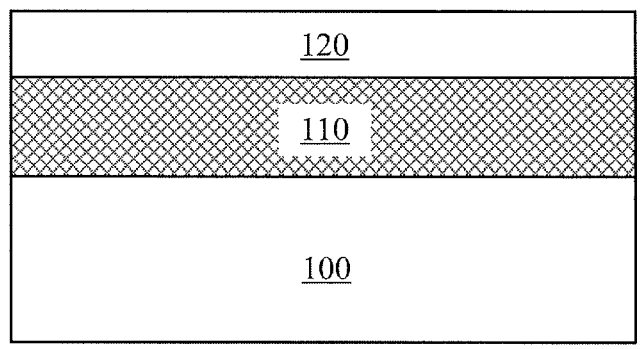
FIG. 3 and FIG. 4 illustrate cross-sectional diagrams of an SOI structure at respective stages of improving its anti-radiation performance according to the flowchart of the method of the present invention as shown in FIG. 2.

Specifically, as shown in FIG. 3, the SOI structure comprises a substrate 100, a buried oxide layer 110 and a silicon layer 120; wherein, the buried oxide layer 110 is located on the substrate 100, and the silicon layer 120 is located on the buried oxide layer 110.

In the present embodiment, the material of the substrate 100 is mono-Si. Typically, the thickness of the substrate 100 may have, but is not limited to, several hundreds of micrometers, for example, in the range of 0.5 mm-1.5 mm.

The material of the buried oxide layer 110 is $SiO_2$. Typically, the thickness of the buried oxide layer 110 is in the range of 200 nm-400 nm.

The material of the silicon layer 120 is mono-Si, with a thickness in the range of 200 nm-300 nm.

As shown by step S101 in FIG. 2, the buried oxide layer 110 of the SOI structure is radiated and the SOI structure is annealed according to an embodiment of the present invention.

Figure 4:
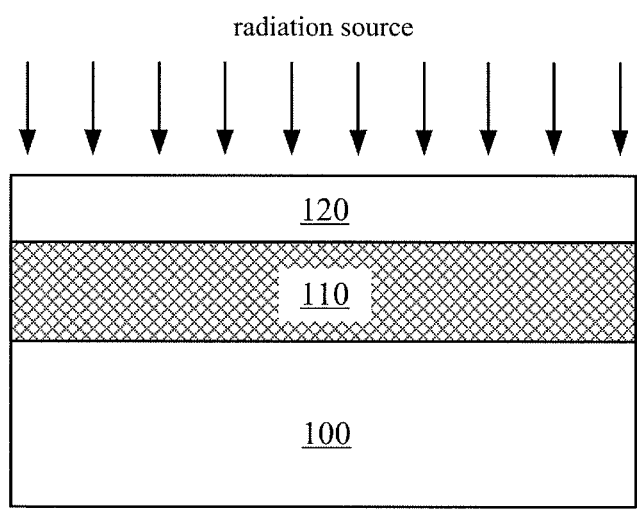

Specifically, as shown in FIG. 4, the SOI wafer is put under an accelerator for radiation, such that high-energy particles are implanted into the buried oxide layer 110, thereby introducing displacement damage into the buried oxide layer 110 so as to form defects. wherein, the high-energy particles for radiation may be protons, neutrons, or may be γ rays. Proton implantation is adopted in the present embodiment, with an implantation dose in the range of $5 \times 10^{16}$ $cm^{-2}$ to $5 \times 10^{17}$ $cm^{-2}$; the energy for the proton implantation is in the range of 30 MeV to 50 Mev, under which protons can steadily go through the silicon layer 120 and get into the buried oxide layer 110, and this would not be affected by the subsequent annealing process. Those skilled in the art should understand that both the dosage and the energy of proton implantation should depend on the specifications of the SOI structure. For example, in the case where the silicon layer 120 has a different thickness other than that mentioned above, the energy of proton implantation will be different so as to ensure than protons are implanted into the buried oxide layer 110; therefore, the range of the proton implantation dose and the range of the energy should not be taken to be limitations on the present invention.

Next, annealing is performed to the SOI structure to eliminate the implantation damage to the silicon layer 120 caused by proton implantation. Since more defects would be introduced into the buried oxide layer 110 because of high-temperature annealing, thus the present invention adopts a practice of annealing the SOI structure by means of low-temperature annealing. Defects in the buried oxide layer 110 resulted from annealing can be reduced as far as possible through controlling the annealing temperature and the period of time of annealing. Wherein, the temperature for the low-temperature annealing is preferably in the range of 800° C. to 900° C.

Preferably, multiple times of implantation and multiple times of annealing are adopted to lessen the damage caused by proton implantation to the silicon layer 120. Namely, after implementation of proton implantation to the buried oxide layer 110 and annealing of the same, aforesaid steps of proton implantation and annealing are repeated several times according to the specific circumstances. The use of multiple times of proton implantation in addition to annealing enables the defects resulted from the implantation to distribute in the silicon layer 120 more evenly and, at the meantime, to reduce damage to the top silicon film at the front of the SOI device thereby lessening influence on the performance of the SOI device caused by the radiation.

As compared to the prior art, the present invention has the following advantages: defects are formed through introducing displacement damage in the buried oxide layer by means of radiating high-energy particles, for example, protons and neurons; the defects are analogous to the recombination centres that can shorten the lifetime of carriers; in this way, the large number of electron-hole pairs generated by the radiation can be recombined by the recombination centres, thereby significantly reducing the number of holes captured by the hole traps in the buried oxide layer. Additionally, the proton implantation introduces no more than displacement damage to the buried oxide layer, which will not affect the electrical neutral characteristic of SOI devices as compared to the introduction of deep electron traps or recombination centres into the buried oxide layer by means of ion implantation in the prior art, so the method of the present application would not cause adverse effects, such as drift of back gate threshold voltage of SOI devices, which subsequently causes changes to the electrical characteristic of the buried oxide layer. Accordingly, the method is capable of effectively improving anti-radiation performance of the back gate buried oxide layer of SOI structures, thereby improving the anti-radiation performance of SOI devices.

Figure 5:
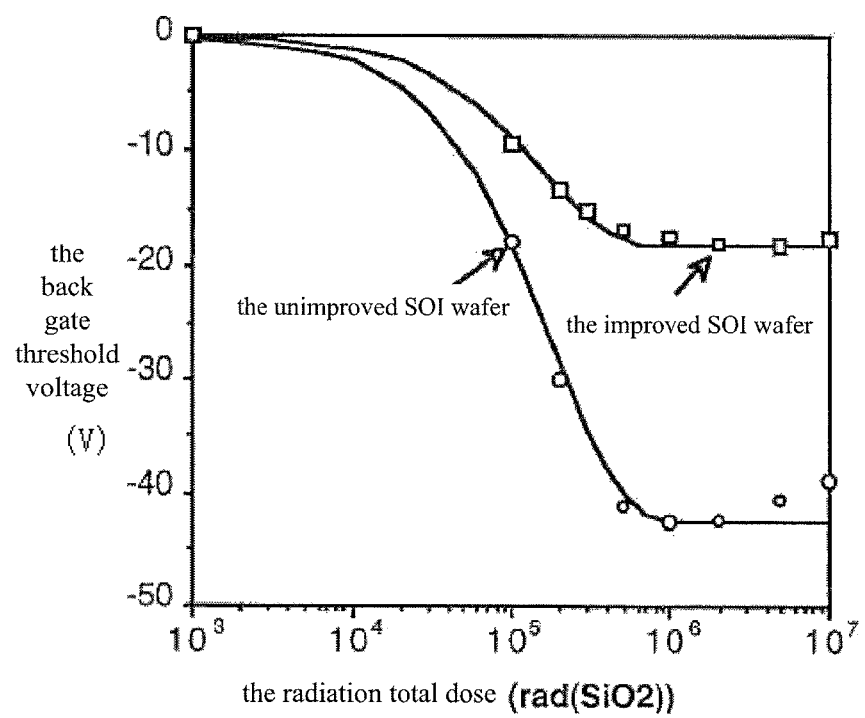
FIG. 5 illustrates a relative data chart of the back gate threshold voltage to the radiation absorption total dosage in respective cases of an improved SOI wafer and an unimproved SOI wafer.

Here below, the anti-radiation performance of an SOI wafer improved according to the method provided by the present invention is compared with the anti-radiation performance of an unimproved SOI wafer, in light of the experiment results. As shown in FIG. 5, which illustrates a relative data chart of the back gate threshold voltage to the radiation absorption total dose in respective cases of the improved SOI wafer and the unimproved SOI wafer. Wherein the x-coordinate denotes the radiation total dosage, while the y-coordinate denotes the back gate threshold voltage of SOI wafers. The industrial standard SmartCut SOI wafers are used in the experiments, whose thickness is 370 nm, and the thickness of the silicon layer is 300 nm; the original wafer for manufacturing the SOI structure is P-type Si at [100] crystal orientation, with electrical resistance of 10 Ω·cm to 20 Ω·cm. wherein, in the process of improving the SOI wafer, protons of the volume of $5\times10^{16}$ cm$^{-2}$ to $5\times10^{17}$ cm$^{-2}$ are implanted into the buried oxide layer, with implanting energy of 30 MeV to 50 MeV, and annealing is performed at the temperature of 850° C. Besides, aforementioned steps of proton implantation and annealing are repeated several times to the SOI wafer for the purpose of reducing damage caused by proton implantation to the silicon layer. In the radiation experiment, both the improved SOI wafer and the unimproved SOI wafer are put under 60 Co radiation source for conducting total dose radiation. As shown in FIG. 5, in the case of receiving the same radiation total dose, the drift of the back gate threshold voltage happening to the improved SOI wafer after irradiation is far less than the drift of the back-gate threshold voltage happening to the unimproved SOI wafer. Namely, the SOI wafers improved according to the method of the present invention shows an anti-radiation performance far better than that of the unimproved SOI wafer.

Although the exemplary embodiments and their advantages have been described in detail, it should be understood that various alternations, substitutions and modifications may be made to the embodiments without departing from the spirit of the present invention and the scope as defined by the appended claims. For other examples, it may be easily recognized by a person of ordinary skill in the art that the order of processing steps may be changed without departing from the scope of the present invention.

In addition, the scope to which the present invention is applied is not limited to the process, mechanism, manufacture, material composition, means, methods and steps described in the specific embodiments in the specification. According to the disclosure of the present invention, a person of ordinary skill in the art would readily appreciate from the disclosure of the present invention that the process, mechanism, manufacture, material composition, means, methods and steps currently existing or to be developed in future, which perform substantially the same functions or achieve substantially the same as that in the corresponding embodiments described in the present invention, may be applied according to the present invention. Therefore, it is intended that the scope of the appended claims of the present invention includes these process, mechanism, manufacture, material composition, means, methods or steps.

What is claimed is:

1. A method for improving anti-radiation performance of an SOI structure comprising following steps:
   a) implementing high-energy particle implantation to a buried oxide layer of the SOI structure and then performing annealing process; wherein
   the high-energy particle implantation introduces displacement damage to the buried oxide layer of the SOI structure.

2. The method of claim 1, wherein the step of implementing high-energy particle implantation to the buried oxide layer comprises:
   implementing high-energy particle radiation implantation to the buried oxide layer by means of radiating the SOI structure.

3. The method of claim 2, wherein:
  the high-energy particle of radiation is any one selected from a group consisting of protons, neutrons, γ-ray or combinations thereof.
4. The method of claim 2, wherein:
  the dosage of the high-energy particle implantation is in the range of $5\times10^{16}$ cm-2 to $5\times10^{17}$ cm-2, and the energy for the high-energy particle implantation is in the range of 30 MeV to 50 MeV.
5. The method of claim 2, wherein the annealing is implemented at a temperature in the range of 800° C. to 900° C.
6. The method of claim 1, wherein the step of implementing high-energy particle implantation to the buried oxide layer comprises:
  implementing high-energy particle radiation implantation to the buried oxide layer by means of radiating the SOI structure.

* * * * *